United States Patent
Zimmermann et al.

[11] Patent Number: 5,925,205
[45] Date of Patent: Jul. 20, 1999

[54] METHOD FOR MANUFACTURING A NOZZLE PLATE

[75] Inventors: Georg Zimmermann, Gerlingen; Wilfried Aichele, Winnenden; Gottfried Flik, Leonberg; Guenter Dantes, Eberdingen; Gilbert Moersch; Detlef Nowak, both of Stuttgart; Joerg Heyse, Markgroeningen; Juergen Hackenberg, Sachsenheim, all of Germany

[73] Assignee: Robert Bosch GmbH, Stuttgart, Germany

[21] Appl. No.: 08/838,963

[22] Filed: Apr. 23, 1997

[30] Foreign Application Priority Data

Jun. 4, 1996 [DE] Germany .............. 196 22 350

[51] Int. Cl.$^6$ ................. C25D 1/10; B05B 1/30
[52] U.S. Cl. ............ 156/150; 156/245; 239/575; 239/590.3
[58] Field of Search ................. 239/575, 590.3; 205/50, 70, 75, 150, 600; 156/150, 245

[56] References Cited

U.S. PATENT DOCUMENTS

| | | | |
|---|---|---|---|
| 4,675,083 | 6/1987 | Bearss et al. | 205/50 |
| 4,828,184 | 5/1989 | Gardner et al. | 239/590.3 |
| 5,685,491 | 11/1997 | Marks et al. | 205/70 X |
| 5,730,368 | 3/1998 | Flik et al. | 239/575 |

FOREIGN PATENT DOCUMENTS 44 35 163   4/1996   Germany .

*Primary Examiner*—Michael W. Ball
*Assistant Examiner*—Shawn A. Mitchell
*Attorney, Agent, or Firm*—Kenyon & Kenyon

[57] ABSTRACT

In a method for manufacturing a nozzle plate, two parts of the nozzle plate are fabricated separately from one another. The fabrication of the two parts is carried out by microstructuring/lithography, electroforming and plastic molding. Advantageously, a filter structure is provided in the first part. The two parts are joined together by means of laser welding, diffusion soldering or a chemical joining process. The nozzle plate is particularly well suited for injection valves, atomization nozzles, paint spray nozzles or other spraying systems.

11 Claims, 3 Drawing Sheets

METHOD FOR MANUFACTURING A NOZZLE PLATE

BACKGROUND INFORMATION

It is known from German Unexamined Patent Application No. 44 35 163 to manufacture an upper and a lower section of a nozzle plate by combining the "MIGA" technique (microstructuring-electroforming-molding) and the "LIGA" technique (lithography-electroforming-molding). Such fabrication can be accomplished on panels (wafers) with several hundred nozzle plates arranged in the shape of a grid, a method which strongly reduces the amount of work per nozzle plate. The fabrication technology for each individual nozzle plate, however, is still relatively complicated and tedious. It is particularly tedious that during the preparation of the nozzle plates the cavities must be evacuated and then filled with, for example, liquid PMMA by injection molding. Around the plastic part, freed from the injection mold and a pressing die (negative part), a metallic layer is formed by electroplating. The negative plastic part must then again be removed from the nozzle plate to obtain in the desired cavities in this plate through which a medium will flow.

SUMMARY OF THE INVENTION

The method according to the present invention for manufacturing a nozzle plate has the advantage that, by use of conventional "MIGA" or "LIGA" process technology, it is possible to create structures with geometric undercuts or cavities. The geometric limitations imposed by "MIGA" technology can be overcome by use of the method according to the present invention for manufacturing a two-part nozzle plate. Nozzle plates with two micromechanically produced parts can be made on a common panel with high accuracy, at low cost and in large numbers. Injection molding of plastic parts followed by electroplating and then by the joining of the two parts represents a simple fabrication process for making a very accurate nozzle plate.

It is of great advantage to be able to create a filter structure in the nozzle plate in a simple fashion. The filter structure makes it possible to filter out large particles and, thus, to keep such dirt particles away from the sensitive discharge geometry of the nozzle plate. Moreover, it ensures a uniform flow rate of the medium which, for example in the case of a ring gap nozzle, results in uniform distribution of the medium over the entire ring gap.

It is particularly advantageous to use chemical joining as the connection technique for assembling the two parts of the nozzle.

DETAILED DESCRIPTION

Figure 1:
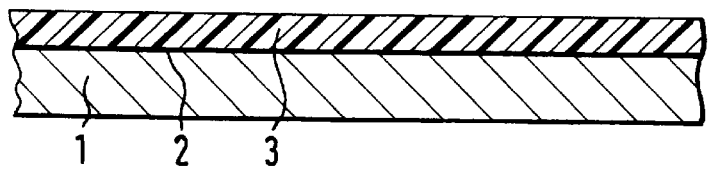
FIG. 1 shows a first process step for making a first part of a nozzle plate.
Figure 13:
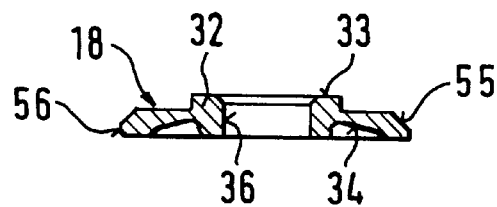
FIG. 13 shows a fourth process step for making a second part of a nozzle plate.
Figure 14:
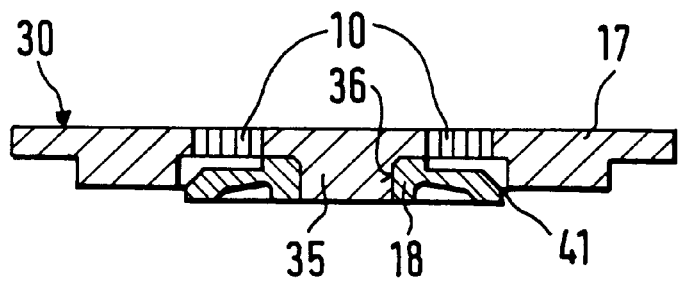
FIG. 14 shows a longitudinal cross-section of a first nozzle plate including the parts according to FIGS. 9 and 13.

FIGS. 1 to 15 illustrate a method for manufacturing a nozzle plate 30 (FIG. 14). In a first process step, to produce a first part (filter structure part 17) of the two-part nozzle plate, a bonding layer 2 is applied, for example by sputtering, to a stable metallic support plate 1 composed of, for example, titanium. The thickness of this bonding layer 2 is only a few hundred nm. An approximately 250 $\mu$m thick layer 3 of a thermoplastically deformable polymer, for example polymethyl methacrylate (PMMA), is then cast onto this bonding layer (FIG. 1).

Figure 2:
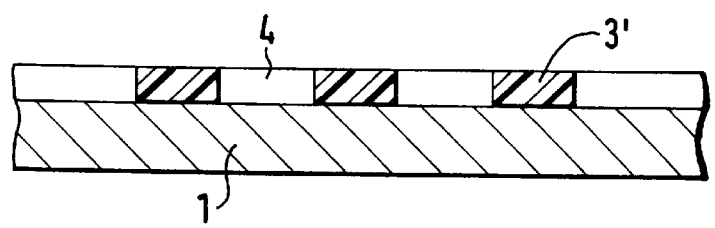
FIG. 2 shows a second process step for making a first part of a nozzle plate.

A mask with transparent and nontransparent areas, not shown, is placed over the layer composite composed of support plate 1 and layer 3. This composite is then patterned by exposing the mask, which represents the desired geometry of the subsequently produced nozzle plate 30, to synchrotron radiation. According to the generally known "LIGA" technology, a polymer is treated with synchrotron radiation, subsequently exposed to light and then developed so that regions 3' of the polymer that have not been exposed to synchrotron radiation are available as surface structures. The wet-chemical development step creates regions 3' of the polymer (PMMA). The regions constitute the outer region of a ring gap, which, for example, is later wanted in the nozzle plate, as well as the receiving region for the second part of the nozzle plate. Because of the high accuracy of the process, very close tolerances can be observed in these process steps (FIG. 2).

Figure 3:
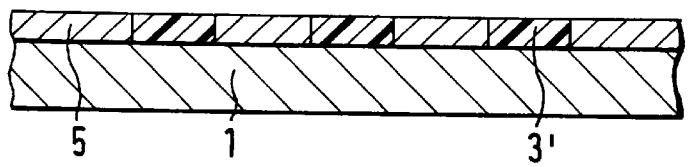
FIG. 3 shows a third process step for making a first part of a nozzle plate.

In the next process step, metallic support plate 1 with structured layer 3 is electroplated to form an electroplated layer 5 in interstices 4 created between regions 3'. Copper is a particularly suitable metal for this electroplating step. Subsequently, the desired final height, for example 200 $\mu$m, of this layer 5 is obtained by mechanical treatment (for example, buffing or diamond milling) which generates a planar surface (FIG. 3).

Figure 4:
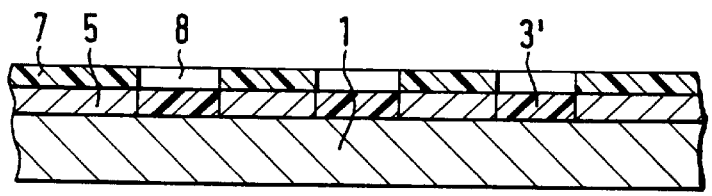
FIG. 4 shows a fourth process step for making a first part of a nozzle plate.

Subsequently, another polymer layer 7, for example a PMMA layer, is cast onto layer 5 on the existing part. The top polymer layer 7 (which, for example, is 155 $\mu$m thick) is then roughly prestructured, for example by milling, in the region of the subsequent ring gap and in the region that will receive the second part of the nozzle plate. Free spaces 8 thus created in top layer 7 are located exactly where, in the underlying layer 5, regions 3' of the polymer were retained. This is necessary to be able to dissolve out the PMMA of layer 5, namely regions 3' (FIG. 4).

Figure 5:
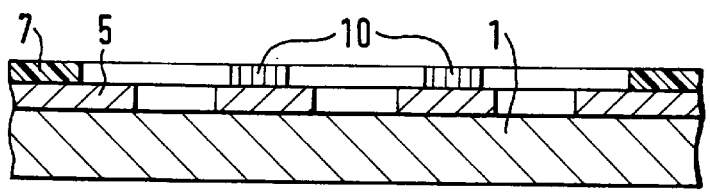
FIG. 5 shows a fifth process step for making a first part of a nozzle plate.

Over the resulting structure is once again placed a finely patterned photolithographic mask with transparent and nontransparent areas (deep x-ray lithography). In a second irradiation step, a filter structure 10 is created first. Filter structure 10 created in layer 7 has very fine pores. The fine porosity of filter structure 10 is achieved by providing a large number of pores disposed, for example, parallel to the longitudinal axis of the nozzle plate and separated from one another by thin webs. The pores can have polygonal (for example honeycomb-shaped), round or elliptical cross-sections. Because of the exact definition of the regions of layer 5, no special requirements are placed on the alignment accuracy during the second patterning. Exposure and development of the entire structure on support plate 1 affords the negative of a mold for making the upper, first part 17 (FIG. 9) of the nozzle plate possessing a filter function (FIG. 5).

Figure 6:
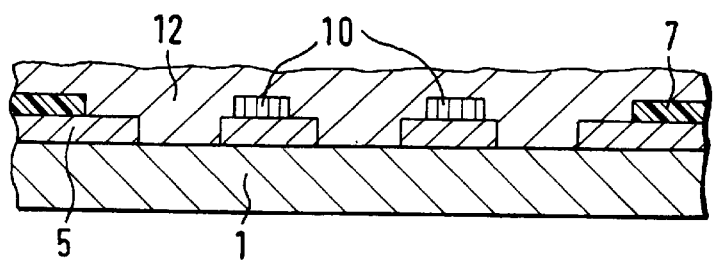
FIG. 6 shows a sixth process step for making a first part of a nozzle plate.

In a next process step, the negative of the shaping mold is filled or enveloped by electrolytic deposition of a metal, for example NiCo. The resulting metal layer 12 represents an accurate negative replica of the mold (FIG. 6).

Figure 7:
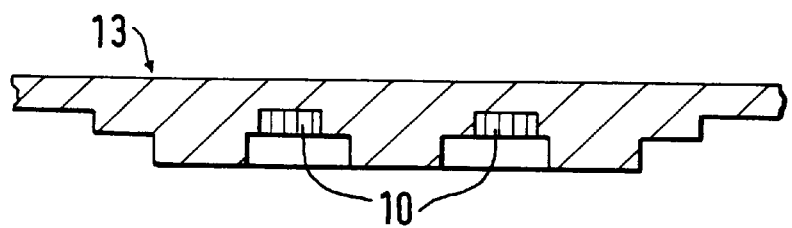
FIG. 7 shows a seventh process step for making a first part of a nozzle plate.
Figure 8:
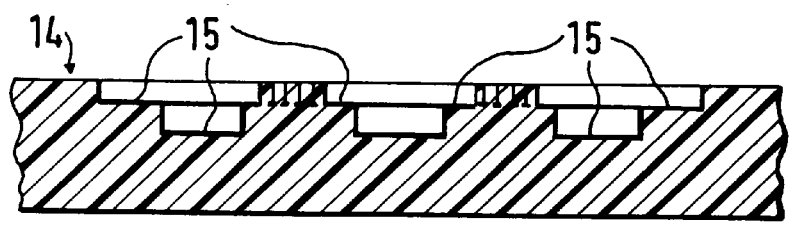
FIG. 8 shows an eighth process step for making a first part of a nozzle plate.

FIG. 7 shows the stripped mold 13. To obtain this mold 13 in the manner shown, the separated layer 12 is first mechanically adjusted to its final outer dimensions. Support plate 1 is then separated, layer 5 (Cu) is removed by wet-chemical etching with an alkaline etchant, and the structured plastic (PMMA layer 7) is removed by dissolution in an organic solvent. This mold 13 (made, for example, of NiCo) can now be replicated to create daughter generations by use of a polymer injection molding process followed by electroforming (FIG. 8).

Mold 13 can thus be used to make a large number of negatives. By microinjection molding, the negatives of mold 13 can be made from a plastic material. Once again, for example, polymethyl methacrylate (PMMA) is used for this purpose. For the subsequent electroplating, the plastic negatives 14 thus obtained are metallized on the side facing shaping mold 13 by a chemical process (metal layer 15). Because filter structure is linked together by the webs between the pores, electric contact with the entire panel is possible (FIG. 8).

Figure 9:
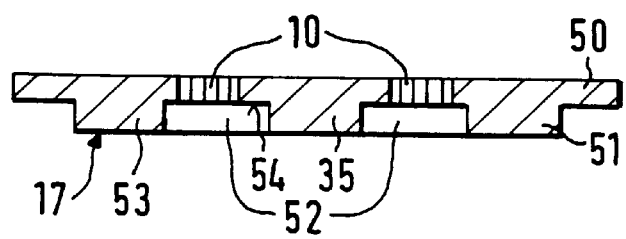
FIG. 9 shows a ninth process step for making a first part of a nozzle plate.

The metallized plastic negatives 14 are then filled with NiCo by an electrolytic process (electroforming). This produces the first part of the nozzle plate, namely filter structure part 17. After electrodeposition, filter structure part 17 receives its final configuration by buffing and subsequent removal of the polymer by dissolution (FIG. 9).

Figure 15:
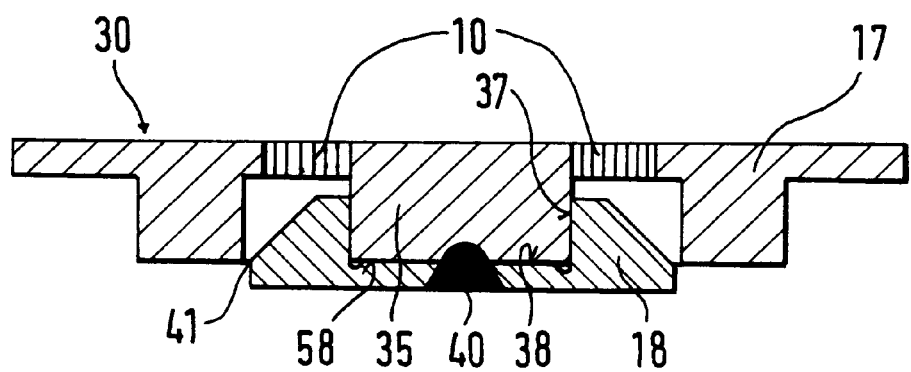
FIG. 15 shows a longitudinal cross-section of a second nozzle plate.

Filter structure part 17 includes two axially sequential planes 50, 51. Whereas the upper round plane 50 which, for example, contains filter structure 10 disposed in annular fashion and, with the exception of this finely porous filter structure 10, is entirely solid, the lower plane 51 which is also round and has, for example, a slightly smaller diameter than upper plane 50, contains an internal material region (adjusting element 35), a radially adjacent annular free region 52, and an external annular solid region 53 which radially completely surrounds this free region 52. Central adjusting element 35 serves to provide a better fit between parts 17 and 18 of nozzle plate 30, so that, when nozzle plate 30 is assembled, the lower part 18 of the nozzle plate substantially fills free region 52 of lower plane 51 (FIGS. 14, 15). Filter structure 10 ends at a lower end face of upper plane 50 in the annular channel-like free region 52. This region is limited toward upper plane 50 but is open downward so that lower part 18 of the nozzle plate can be inserted into this region and, for example, form ring gap 41 (FIGS. 14, 15).

Figure 10:
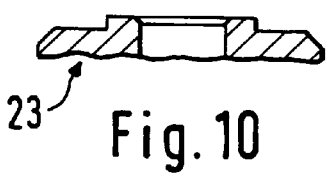
FIG. 10 shows a first process step for making a second part of a nozzle plate.

The process steps for making the second part of the nozzle plate, namely lower nozzle part 18, are illustrated in FIGS. 10 to 13. In a first process step, mold 23 is very accurately structured by diamond milling. This mold 23 is already very accurately provided with the contours required for lower nozzle part 18. The desired beveling on mold 23 can also be produced by diamond milling. Mold 23 later serves as the mold for the polymer injection molding of negatives (FIG. 10).

Figure 11:
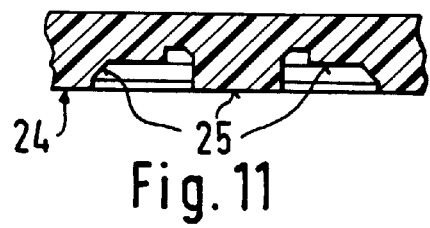
FIG. 11 shows a second process step for making a second part of a nozzle plate.

A plastic negative 24 of mold 23 is prepared by micro-injection molding. Here, once again, the polymer used is, for example, PMMA. On the side to be molded, the resulting plastic negative 24 is then provided with a conductive layer for electroplating (metal layer 25). Chemical processes or plasma or spraying processes are used for this purpose (FIG. 11).

Figure 12:
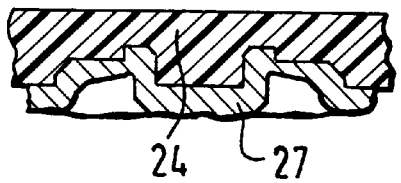
FIG. 12 shows a third process step for making a second part of a nozzle plate.

FIG. 12 shows an electroplated plastic negative 24. By electroforming, a metal, for example NiCo, is deposited onto metal layer 25 on plastic negative 24. As a result of electroplating, the growing metal layer 27 adheres tightly to plastic negative 24 so that the previously formed contours are truly reproduced in it.

Lower nozzle part 18 made of NiCo, with its final dimensions, is obtained by polishing the plastic-metal composite shown in FIG. 12 and then removing plastic negative 24 from metallic layer 27 with an organic solvent. The resulting lower nozzle parts 18 are thus obtained as separate parts (FIG. 13).

Annular lower nozzle part 18 has a central internal passage 36 which can accurately fit into adjusting element 35 of filter structure part 17. The outer dimensions of lower nozzle part 18 are fixed by the size of free region 52 into which this part enters at least partly. In addition to the accurate fabrication of passage 36, an upper stop shoulder 32 protruding toward filter structure part 17 and having an upper end face 33 is also fabricated very exactly. A lower end face 34 of lower nozzle part 18 opposite stop shoulder 32 does not require exact machining, because this region is not involved in the joining and lies outside the flow path.

The stepped outer contour comprises, for example, a circumferential bevel 55 which, when nozzle plate 30 is in the assembled state, lies in free region 52 and facilitates the flow of a fluid from filter structure 10 to the discharge geometry (ring gap 41). Bevel 55, which becomes wider in the direction of flow, is followed, for example, by a vertical limiting surface 56 which, after assembly, is located downstream of filter structure part 17 or ring gap 41.

In a last process step, filter structure part 17 (FIG. 9) and lower nozzle part 18 (FIG. 13) are assembled to form a nozzle plate 30, in the practical example presented here a ring gap nozzle, and are joined together (FIG. 14). Filter structure part 17 and lower nozzle part 18 must be exactly joined together. Lower nozzle part 18 is therefore provided, for example, with stop shoulder 32 extending as far as filter structure part 17 (FIG. 13), with, for example, a circumferential groove being provided in end face 33 of stop shoulder 32. During the joining together of the two parts 17 and 18, the contact surface between these parts is thus reduced which results in higher surface pressure. The end faces 54 and 33 of the two parts, 17 and 18, fit together more closely and more accurately which ensures very good axial joining accuracy. To increase radial surface pressure, it is also possible to structure the peripheral surface of pin-shaped adjusting element 35, which in the upper filter structure part 17 is disposed centrally and which extends into lower nozzle part 18. In this manner it is possible to provide, for example, four grooves axially oriented and equally distributed over the periphery of adjusting element 35.

FIG. 15 shows another two-part nozzle plate 30 for which the process steps are the same as for that represented in FIG. 14, but which differs from nozzle plate 30 shown in FIG. 14 primarily in the design of lower nozzle part 18. Whereas lower nozzle part 18 made by the process steps shown in FIGS. 1 to 14 has a central, axially disposed passage 36 for receiving adjusting element 35 of filter structure part 17, lower nozzle part 18 of the practical example represented in FIG. 15 has only central, blind hole-like opening 37. Adjusting element 35 of structure filter part 17 extends into this opening 37 and rests against bottom 38 of opening 37 of lower nozzle part 18. Stop shoulder 32 present in the first practical example is not needed in the practical example shown in FIG. 15, because the stop region of both part 17 and part 18 constitutes bottom 38 of opening 37 at lower end face 58 of adjusting element 35. This variant results in unusually good joining accuracy. Overall, the structure of lower nozzle part 18 of this second version according to FIG. 15 is more stable than that of lower nozzle part 18 according to FIG. 14.

Suitable assembly techniques for an exact, positionally accurate joining of parts 17 and 18 with as slight negative mechanical and thermal effects as possible are, in particular, laser welding, diffusion soldering or chemical joining processes. FIG. 15 shows the possibility of laser welding whereby parts 17 and 18 in the area of bottom 38 are joined together at a central welding spot 40. In chemical joining, a joining material which brings about a chemical reaction is placed in the adaptation region between parts 17 and 18. This can also be achieved, for example, by applying a corroding layer (for example, aluminum, titanium, vanadium, tungsten or silicon) whereby local oxidation is intentionally started at the same time.

All dimensions of nozzle plate 30 or of the individual layers are provided only for a better understanding of the present invention and do not limit the present invention in any manner.

The design of nozzle plate 30 as a ring gap nozzle with a closed, completely circumferential ring gap 41 represents only one possible contour. Besides this preferred embodiment of the present invention, the same fabrication technology according to the present invention can be used to produce two-part nozzle plates 30 with a discharge geometry different from that of ring gap 41.

Nozzle plate 30 can be used, for example, in a fuel injection valve as described in German Patent Application No. DE-OS 44 35 163, the disclosure of which is hereby expressly incorporated by reference into the present application. The described nozzle plates are not intended exclusively for use in injection valves. They can also be used, for example, in paint spray nozzles, inhalators, ink jet printers or freeze-drying processes, for example for the spraying or injection of liquids, for example beverages.

What is claimed is:

1. A method for manufacturing a nozzle plate having an inlet and an outlet for a medium, comprising the steps of:

fabricating a first part, the fabricating step including the step of creating a structure for making a first mold by applying and structuring at least two polymer layers onto a support plate, a filter structure being provided in the structure, the first mold having a shape fabricated on the structure by electroforming and by a subsequent mechanical treatment, the first mold being used in an injection molding process so as to obtain a first plastic negative, the step of fabricating the first part including the substep of electroforming the first part, the first plastic negative serving for electroforming the first part;

fabricating a second part separately from the first part by making a second mold by mechanical treatment and by producing a second plastic negative on the second mold by injection molding of a polymer, the step of fabricating the second part including the substep of electroforming the second part, the second plastic negative serving for electroforming the second part; and after a fabrication of the second part and a fabrication of the first part are completed, joining together the completed first part and the completed second part such that the outlet for the medium is located at an outer contour of the nozzle plate and is created between the first and second parts.

2. The method according to claim 1, wherein a thermoplastically deformable polymer is used as a plastic for producing the at least two polymer layers and each of the first plastic negative and the second plastic negative.

3. The method according to claim 2, wherein the thermoplastically deformable polymer includes PMMA.

4. The method according to claim 1, wherein at least one of the at least two polymer layers is structured by deep x-ray lithography to produce the filter structure.

5. The method according to claim 1, wherein the electroforming of the first and second parts on the first and second plastic negatives is carried out with NiCo.

6. The method according to claim 1, wherein the mechanical treatment of at least one of the first and second molds is carried out by at least one of diamond milling and diamond machine-cutting.

7. The method according to claim 1, further comprising the step of providing the first and second plastic negatives with first and second metal layers, respectively, before electroforming.

8. The method according to claim 1, wherein the first and second parts are joined together by laser welding.

9. The method according to claim 1, wherein the first and second parts are joined together by diffusion soldering.

10. The method according to claim 1, wherein the first and second parts are joined together by a chemical joining process, and wherein the chemical joining process includes applying a material layer to a joining region of the first and second parts so as to start a chemical reaction.

11. The method according to claim 10, wherein a local oxidation is started at the joining region by applying a corroding layer to the joining region.

* * * * *